United States Patent
Aritome (10) Patent No.: US 7,539,066 B2
(45) Date of Patent: May 26, 2009

(54) METHOD, APPARATUS, AND SYSTEM FOR IMPROVED ERASE OPERATION IN FLASH MEMORY

(75) Inventor: Seiichi Aritome, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 136 days.

(21) Appl. No.: 11/617,516

(22) Filed: Dec. 28, 2006

(65) Prior Publication Data

US 2008/0159009 A1    Jul. 3, 2008

(51) Int. Cl.
*G11C 16/04* (2006.01)

(52) U.S. Cl. .............................. 365/185.29; 365/185.18

(58) Field of Classification Search ............ 365/185.29, 365/185.23, 185.18, 185.22
See application file for complete search history.

(56) References Cited

U.S. PATENT DOCUMENTS 5,995,417 A * 11/1999 Chen et al. ............. 365/185.29
2006/0221709 A1 * 10/2006 Hemink et al. ......... 365/185.29

* cited by examiner

*Primary Examiner*—Huan Hoang
*Assistant Examiner*—Kretelia Graham
(74) *Attorney, Agent, or Firm*—Schwegman, Lundberg & Woessner, P.A.

(57) ABSTRACT

Various embodiments include erasing at least one memory cell of a string of memory cells of a memory device while a control gate of at least one of a first memory cell and a second memory cell of the string of memory cells has a first voltage and while a control gate of each memory cell of a plurality of intermediate memory cells between the first memory cell and the second memory cell has a second voltage. Some embodiments include erase verifying only the first memory cell and second memory cell in a first erase verify operation, and erase verifying the plurality of intermediate memory cells in a second erase verify operation. Other embodiments including additional apparatus, systems, and methods are disclosed.

27 Claims, 7 Drawing Sheets

METHOD, APPARATUS, AND SYSTEM FOR IMPROVED ERASE OPERATION IN FLASH MEMORY

FIELD

Embodiments of this disclosure relate to non-volatile memory devices, including erase operations in flash memory devices.

BACKGROUND

Non-volatile memory devices such as flash memory devices are used to store data or information. Many computers and electronic devices, for example, digital audio players, digital cameras, digital recorders, and cellular phones, have flash memory devices. Flash memory devices may also be used as portable storage devices such as portable Universal Serial Bus (USB) flash drives or "thumb" drives. Flash memory devices may not need power to maintain the information stored in the device.

A flash memory device stores information in numerous memory cells, which are usually formed in a semiconductor chip. Each of the memory cells often has a metal-oxide semiconductor (MOS) transistor with two different transistor gates: a control gate and a so-called "floating" gate. The control gate may be used to turn the transistor on and off to control access to the memory cell. The floating gate may be the place where one or more bits of information is stored in each memory cell.

The value of the information stored in the floating gate may be determined by the amount of electrons or charge in the floating gate. For example, the information stored in the floating gate may have a first value (e.g., logic zero or binary 0 value) when an excess amount of electrons is present in the floating gate and a second value (e.g., logic one or binary 1 value) when the excess amount of electrons is absent from the floating gate. The presence or absence of the excess amount of electrons in the floating gate may be controlled by varying the amount of electrons in the floating gate, for example, by either adding electrons to or extracting electrons from the floating gate.

A flash memory device usually has a programming or write operation to add electrons to the floating gate, and an erase operation to extract electrons from the floating gate. Information in the memory cells may be read in a read operation. Programming, read, and erase operations in a conventional flash memory device usually involve applying voltages to the memory cells, such as to the control gates of the transistors and to other device components within the flash memory device.

A conventional flash memory device may go through many programming, read, and erase operations during its life. Thus, improper control of the voltages applied to the memory cells during these operations may lead to inferior device performance, reliability, or both.

DETAILED DESCRIPTION

Figure 1:
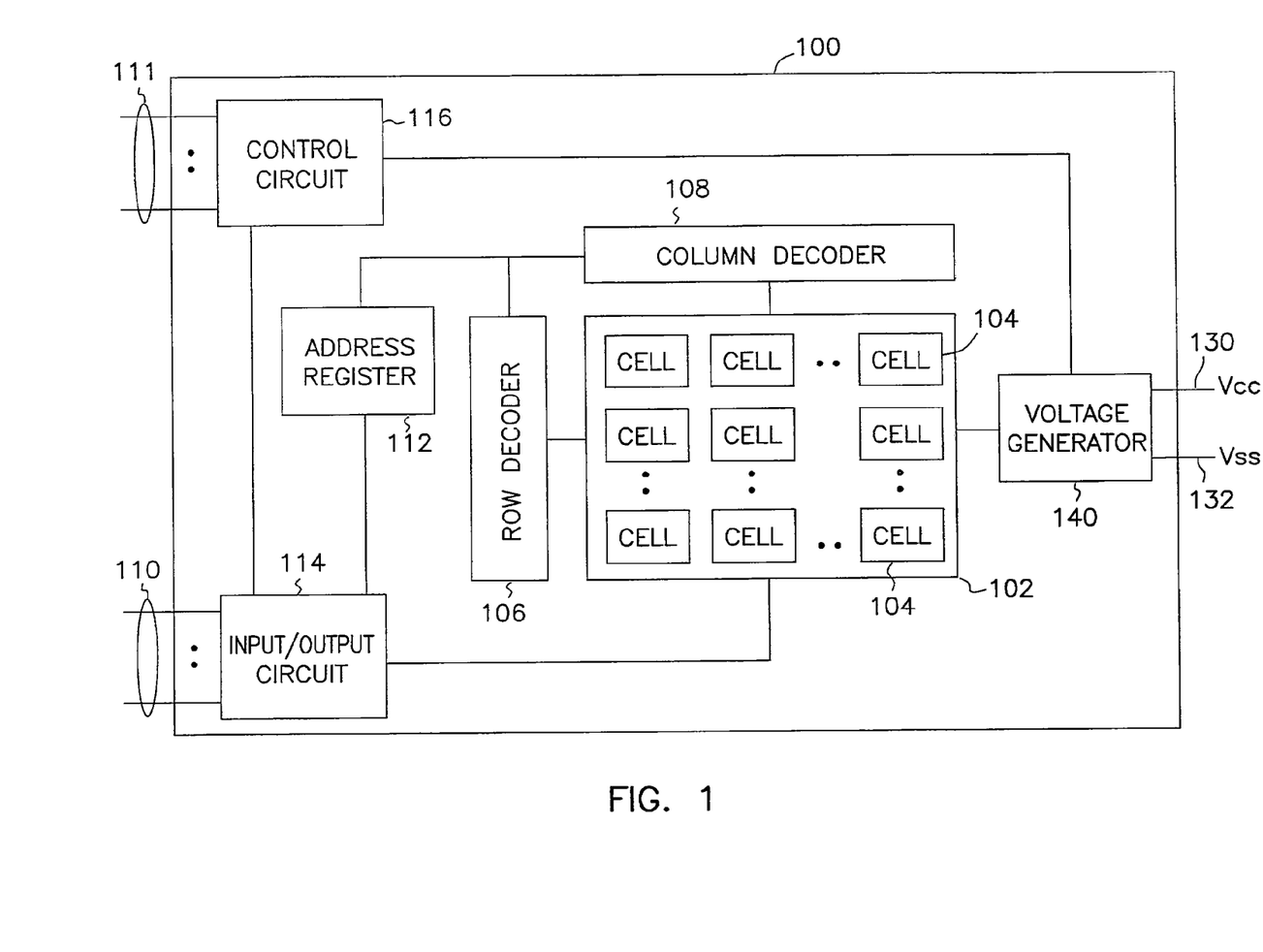
FIG. 1 shows a block diagram of an apparatus including a memory device according to an embodiment of the invention.

FIG. 1 shows a block diagram of an apparatus including a memory device 100 according to an embodiment of the invention. Memory device 100 may include a memory array 102 with memory cells 104 arranged in rows and columns. Row decoder 106 and column decoder 108 may respond to an address register 112 and access memory cells 104 based on row address and column address signals on lines 110. A data input/output circuit 114 may transfer data between memory cells 104 and lines 110. A control circuit 116 may control operations of memory device 100 based on signals on lines 110 and 111. Memory device 100 may include a flash memory device. In some embodiments, memory device 100 may include a NAND flash memory device where memory cells 104 may include flash memory cells arranged in a NAND flash memory arrangement. One skilled in the art will readily recognize that memory device 100 may include other parts, which are omitted from FIG. 1 to focus on the various embodiments described herein.

Memory device 100 may include nodes 130 and 132 to receive voltages Vcc and Vss, respectively. Vcc may be the supply voltage for memory device 100, Vss may be ground. Memory device 100 may also include a voltage generator 140. Voltage generator 140 and control circuit 116 may act separately or together to provide different voltages to memory array 102 or to cause memory array 102 to have different voltages during various operations of memory device 100. The operations may include a programming operation to transfer or write data from lines 110 to memory cells 104, a read operation to transfer or read data from memory cells 104 to lines 110, and an erase operation to erase or clear data from all or a portion of memory cells 104. In some embodiments, memory device 100 may include embodiments of FIG. 2 through FIG. 7 described below.

Figure 2:
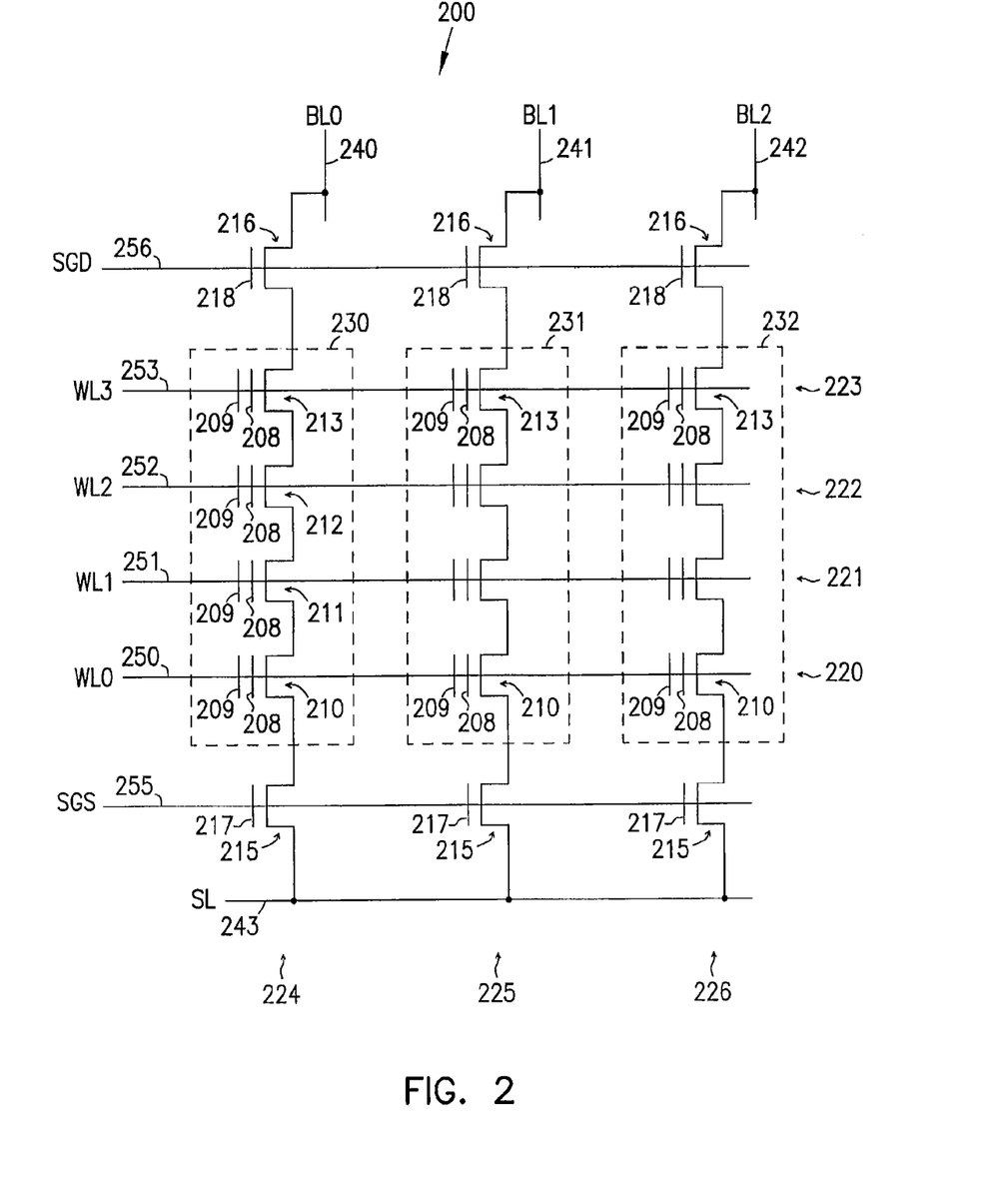
FIG. 2 shows a partial schematic diagram of a memory device according to an embodiment of the invention.

FIG. 2 shows a partial schematic diagram of a memory device 200 according to an embodiment of the invention. Memory device 200 may be included in memory device 100 of FIG. 1. In FIG. 2, memory device 200 may include a number of memory cells 210, 211, 212, and 213 arranged in rows 220, 221, 222, and 223, and columns 224, 225, and 226. The memory cells in the same column may be connected in a series or string of memory cells, such as strings 230, 231, and 232. Within each of strings 230, 231, and 232, memory cells 211 and 212 may be referred to as intermediate memory cells, memory cell 210 may be referred to as a first edge memory cell, and memory cell 213 may be referred to as a second edge memory cell. FIG. 2 shows an example where each string 230, 231, and 232 may include four memory cells 210, 211, 212, and 213. In some embodiments, the number of memory cells in each of strings 231, 232, and 233 may vary. For example, in some embodiments, the number of memory cells in each of strings 231, 232, and 233 may include more than two intermediate memory cells coupled between a first edge memory cell and a second edge memory cell.

In FIG. 2, memory device 200 may include select transistors 215, each being coupled between one of strings 230, 231, and 232 and a source line 243 having source line signal SL. Each select transistor 215 may include a gate 217 coupled to a select line 255. A select signal SGS on select line 255 may be used to activate (turn on) select transistors 215. Memory device 200 may also include select transistors 216, each being coupled between one of strings 230, 231, and 232 and one of bit lines 240, 241, and 242 having corresponding bit line signals BL0, BL1, and BL2, respectively. Each select transistor 216 may include a gate 218 coupled to a select line 256. A select signal SGD on select line 256 may be used to activate select transistors 216.

Each of memory cells 210, 211, 212, and 213 may include a floating gate 208 and a control gate 209. Control gates 209 of memory cells (e.g., memory cells 210) in the same row (e.g., row 220) may be coupled to one of word lines 250, 251, 252, and 253. Word lines signals WL0, WL1, WL2, and WL3 on word lines 250, 251, 252, and 253 may be used activate to memory cells 210, 211, 212, and 213.

FIG. 2 shows each of select transistors 215 and 216 with a single gate (e.g., gate 217 or 218). In some embodiments, each of select transistors 215 and 216 may include two gates, similar or identical to those in each of the memory cells 210, 211, 212, and 213, but the two gates may be tied together (shorted) to act as a single gate transistor.

In FIG. 2, to program, read, or erase memory cells 210, 211, 212, and 213, appropriate voltages may be applied to select lines 255 and 256, word lines 250, 251, 252, and 253, bit lines 240, 241, and 242, and source line 243. In some embodiments, an erase operation of a memory device described herein may include an erase verify operation to verify whether the memory cells of the memory device are properly erased. During an erase operation of memory device 200, appropriate voltages may also be applied to a semiconductor substrate or to a well where memory cells 210, 211, 212, and 213 may be formed. An example embodiment of a semiconductor substrate, a well, and various voltages during an erase operation of memory device 200 is described with reference to FIG. 3 below.

Figure 3:
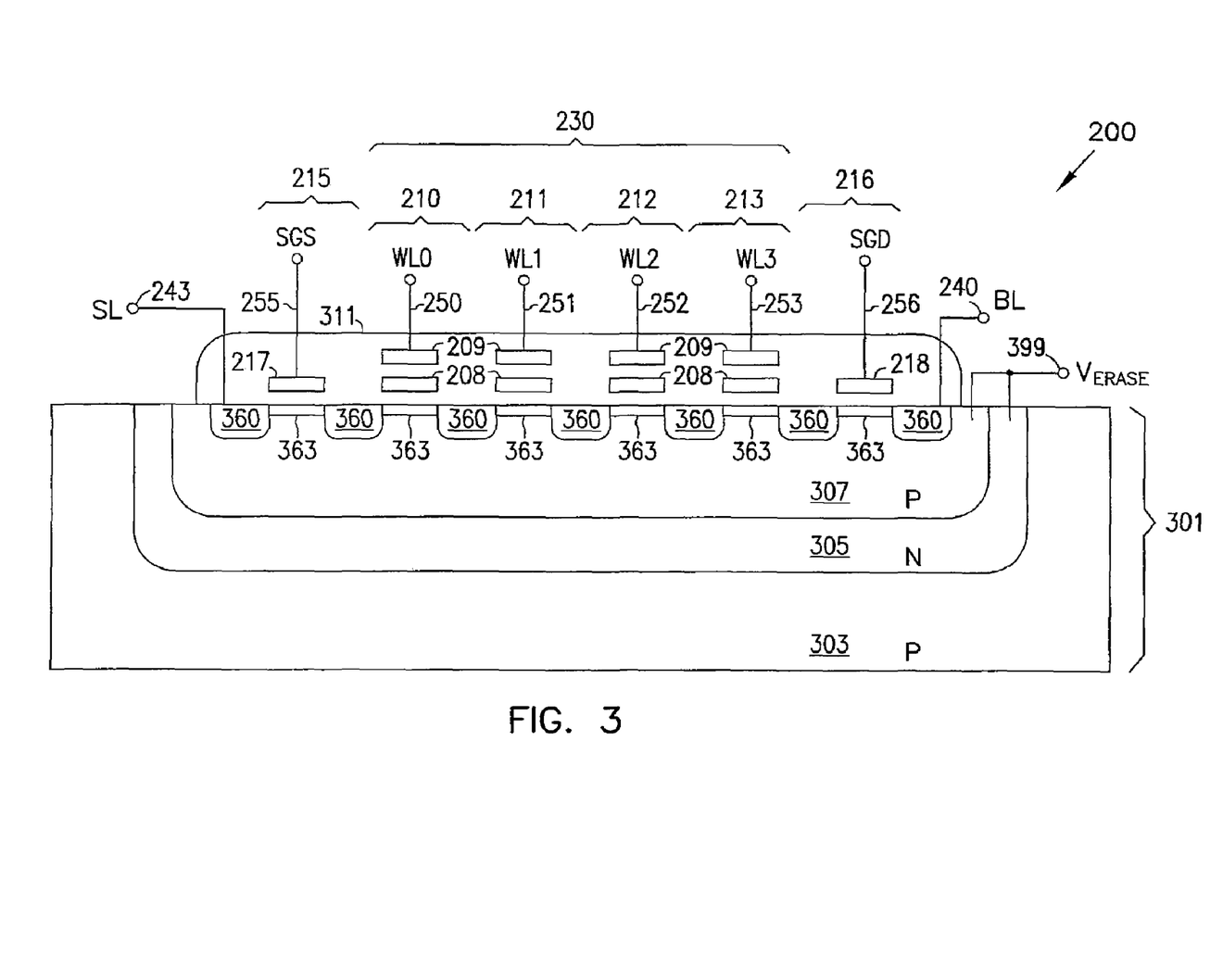
FIG. 3 shows a partial cross-section of a portion of the memory array of FIG. 2.

FIG. 3 shows a partial cross-section of memory device 200 of FIG. 2. In FIG. 3, memory device 200 may include a substrate 301 with substrate portions or wells 303, 305, and 307. "P" and "N" in FIG. 3 indicate different semiconductor material types in various portions of substrate 301. Memory cells 210, 211, 212, and 213 may be formed on well 307 and may be connected in a series or string. FIG. 3 shows a partial cross-section of one string of memory cells (e.g., string 230) of memory device 200. Other strings of memory cells (e.g., strings 231 and 232 in FIG. 2) may have a structure similar or identical to the structure shown in FIG. 3.

As shown in FIG. 3, in each of memory cell 210, 211, 212, and 213, floating gate 208 and control gate 209 may be formed above regions 360 and are isolated from each other by an insulating material 311. Well 305, well 307, or both may be coupled to a node 399 to receive an erase voltage $V_{ERASE}$. Each region 360 may be a source/drain region of a transistor or a source/drain region shared by two memory cells, as shown in FIG. 3.

In the description herein, when WL0, WL1, WL2, and WL3 are mentioned, they may refer to the signals on word lines 250, 251, 252, and 253, word lines 250, 251, 252, and 253 themselves, or the gates of the memory cells (e.g., gates 209) corresponding to WL0, WL1, WL2, and WL3. Further, when SGS is mentioned, it may refer to the signal on a select line (e.g., signal SGS on select line 255), the select line itself (e.g., select line 255), or the gate of a select transistor corresponding to SGS (e.g., gate 217 of select transistor 215). Moreover, when SGD is mentioned, it may refer to the signal on a select line (e.g., signal SGD on select line 256), or the select line itself (e.g., select line 256), or the gate of a select transistor corresponding to SGD (e.g., gate 218 of select transistor 216).

In an erase operation of memory device 200, SGS and SGD may "float" and $V_{ERASE}$ (e.g., about 20 volts or other values) may be applied to well 307. In the description described herein, "float" or "floating" means that a voltage at a line or node (e.g., SGS or SGD) may not be at a fixed at a value but may rise or fall. For example, in an erase operation, the voltage at SGS and SGD may rise when the voltage of well 307 rises (e.g., when $V_{ERASE}$ is applied) and fall when the voltage of well 307 falls (e.g., when $V_{ERASE}$ is removed or well 307 is discharged).

In some embodiments, when string 230 of memory cells 210, 211, 212, and 213 is erased, WL0, WL1, WL2, and WL3 may have different voltages. For example, during an erase operation, WL0 and WL3 may have one voltage while WL1 and WL2 may have another voltage unequal to the voltage at WL0 and WL3.

In some embodiments, when string 230 of memory device 200 is selected to be erased, memory cells 210, 211, 212, and 213 of string 230 may be erased together (at the same time). In other embodiments, when string 230 is selected to be erased, different portions of string 230 may be erased separately (at different times). For example, when string 230 is selected to be erased, only a first portion of string 230 (e.g., only memory cells 210 and 213) may be erased, then only a second portion of string 230 (e.g., only memory cells 211 and 212) may be erased after the first portion is erased.

An erase operation of memory device 200 may also include an erase verify operation. In some embodiments, the erase verify operation may erase verify memory cells 210, 211, 212, and 213 together or separately. For example, an erase verify operation of memory device 200 may erase verify memory cells 210, 211, 212, and 213 separately such that only memory cells 210 and 213 may be erase verified in one erase verify operation and only memory cells 211 and 212 may be erase verified in another erase verify operation. Erase verifying memory cells 210, 211, 212, and 213 separately in some embodiments may reduce erase time because only the memory cells that are unsuccessfully erased (determined by erase verifying operation) may be erased again.

With the arrangement shown in FIG. 3, a capacitance coupling of an edge memory cell (e.g., memory cell 210 or 213) may be relatively lower than that of an intermediate memory cell (e.g., memory cell 211 or 212). Therefore, during an erase operation, the threshold voltage of memory cells 210 and 213 and threshold voltage of memory cells 211 and 212 may be different values. Further, during an erase operation, the relatively lower capacitance coupling of memory cells 210 and 213 may create a relatively higher stress between the floating gate and the control gate of each of memory cells 210 and 213 in comparison to the stress between the floating gate and the control gate of each of memory cells 211 and 212.

In memory device 200, during an erase operation, by keeping WL0, WL1, WL2, and WL3 at different voltages (different values), the threshold voltages for memory cells 210, 211, 212, and 213 may be separately controlled. Therefore, programming or reading of data in the memory cells may be more accurate and stress in memory cells 210 and 213 during the erase operation may be reduced. Thus, memory device 200 may have an improved device performance or reliability, or both.

Figure 4:
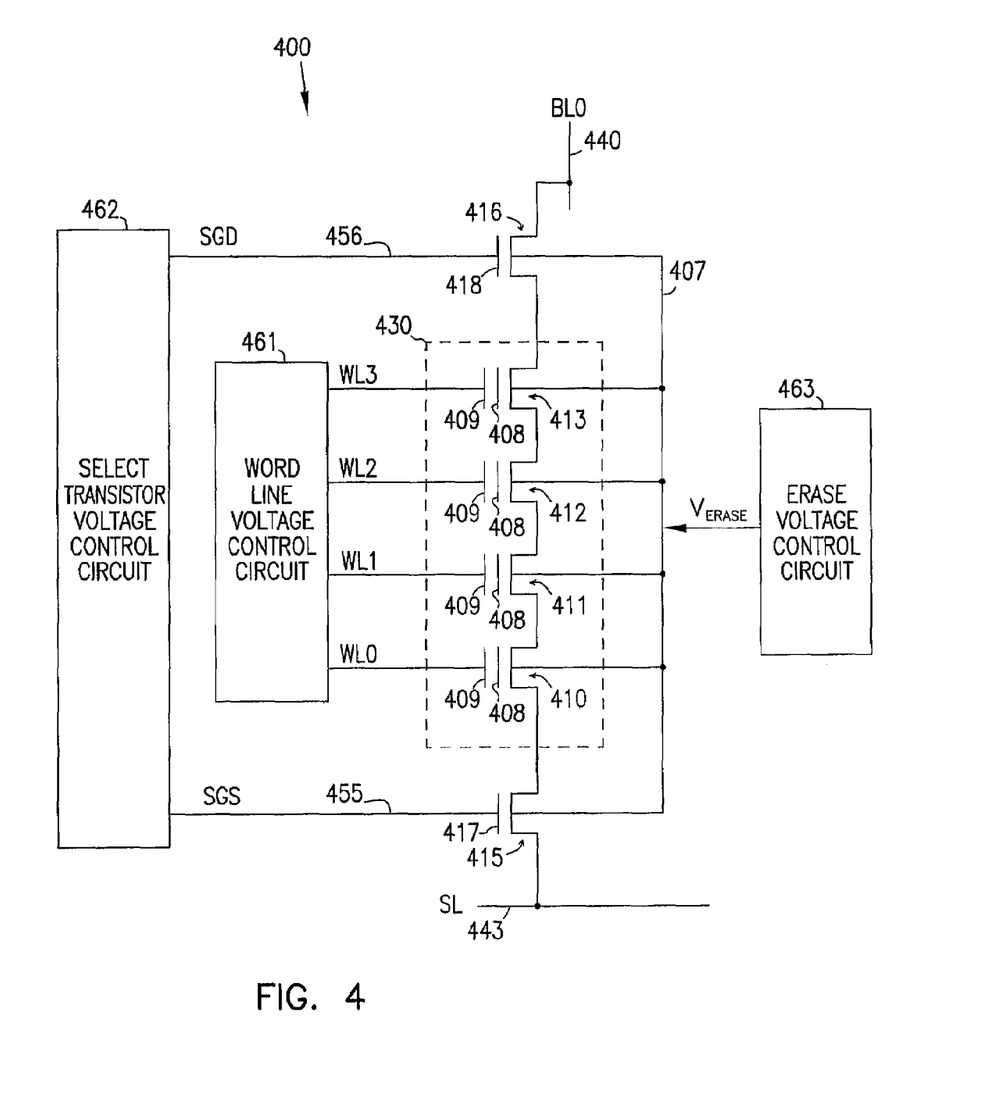
FIG. 4 shows a partial schematic diagram of a memory device according an embodiment of the invention.

FIG. 4 shows a partial schematic diagram of memory device 400 according an embodiment of the invention. In some embodiments, memory device 400 may be included in memory device 100 of FIG. 1. In some embodiments, memory device 400 may include an embodiment of memory device 300 of FIG. 3.

In FIG. 4, memory device 400 may include a string 430 having memory cells 410, 411, 412, and 413 coupled to a bit line 440 (having bit line signal BL0) via a select transistor 416. String 430 may also couple to a source line 443 (having source line signal SL) via a select transistor 415. Control gates 409 of memory cells 410, 411, 412, and 413 may be coupled to receive word lines signals WL0, WL1, WL2, and WL3. Select transistor 415 may include a gate 417 coupled to a select line 455 to receive a select signal SGS. Select transistor 416 may include a gate 418 coupled to a select line 456 to receive a select signal SGD. Memory cells 410, 411, 412, and 413 and select transistors 415 and 416 may be formed on a well of a semiconductor substrate that is similar or identical to one or more of well 305 and well 307 of substrate 301 of FIG. 3. In FIG. 4, the well (on which memory cells 410, 411, 412, and 413 and select transistors 415 and 416 may be formed) is schematically shown as well 407.

Memory device 400 may also include a word line voltage control circuit 461 to control the voltages of WL0, WL1, WL2, and WL3. A select transistor voltage control circuit 462 may control the voltages of SGS and SGD during an erase operation. An erase voltage control circuit 463 may provide an erase voltage $V_{ERASE}$ and control the voltage of well 407 during an erase operation. FIG. 4 shows an example where memory device 400 may include three separate circuits 461, 462, and 463. In some embodiments, circuits 461, 462, and 463 may be separated into more than three circuit, combined into fewer circuits or in a single circuit, or may be at least a part of at least one of a voltage generator and a control circuit, such as voltage generator 140 and control circuit 116 of FIG. 1. FIG. 4 shows an example where memory device 400 may include one string 430 of memory cells. In some embodiments, memory device 400 may include numerous memory strings similar or identical to string 430.

Figure 5:
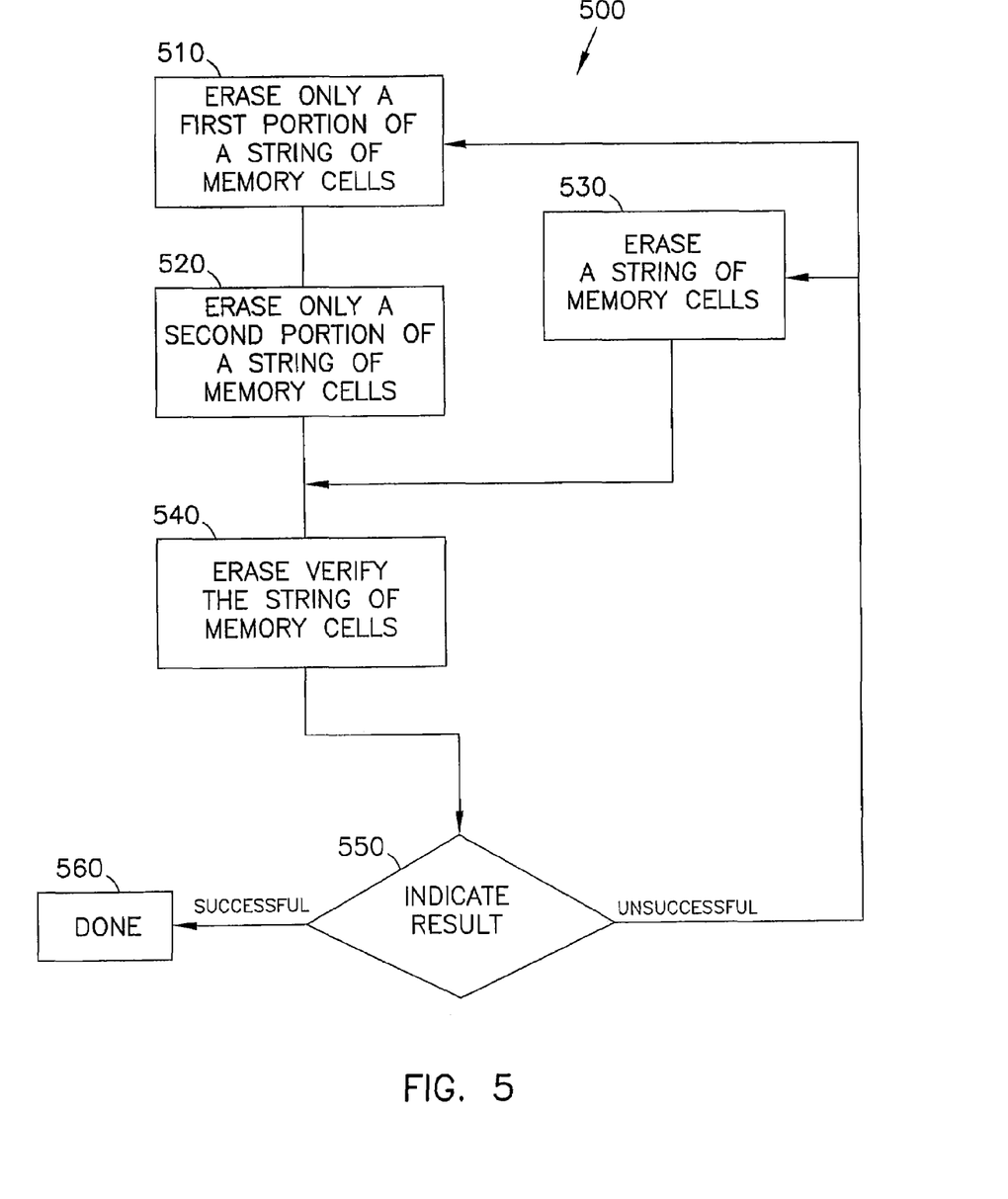
FIG. 5 is a flowchart of a method for an erase operation of the memory device of FIG. 4.

FIG. 5 is a flowchart of a method 500 for an erase operation of memory device 400 according to an embodiment of the invention. The following description refers to FIG. 4 and FIG. 5.

Activity 510 of method 500 in FIG. 5 may erase only a first portion of string 430 of memory cells 410, 411, 412, and 413 and leave a second portion of string 430 not erased (unerased). The second portion of string 430 may be erased separately, after the first portion of string 430 is erased. Each of the first and second portions of string 430 may include fewer memory cells than the total number (i.e., four) of memory cells 410, 411, 412, and 413 of string 430. Thus, activity 510 may erase fewer than all of memory cells 410, 411, 412, and 413. For example, activity 510 may erase only memory cells 411 and 412 and leave memory cell 410 and 413 not erased. In another example, activity 510 may erase only memory cells 411 and 412 plus a first one of memory cells 410 and 413 (e.g., plus memory cell 413), leaving a second one of memory cells 410 and 413 (e.g., memory cell 410) not erased.

In activity 510, circuit 461 (FIG. 4) may cause the word lines corresponding the first portion of string 430 to be at one voltage, and the word lines corresponding the second portion of string 430 to be at another voltage unequal to (lower or greater than) the voltage at the word lines that correspond to the first portion of string 430. For example, when only memory cells 411 and 412 are erased in activity 510, circuit 461 may hold WL1 and WL2 at ground or zero volts (or at some other voltage) and either float WL0 and WL3 or apply to WL0 and WL3 a voltage greater than the voltage at WL1 and WL2. When circuit 461 floats WL0 and WL3 in activity 510, the voltage at each of WL0 and WL3 may be greater than the voltage at WL1 and WL2 (e.g., WL0 and WL3 may be greater than zero volts). In summary, activity 510 may erase only a first portion of string 430 and leave a second portion of string 430 not erased.

Activity 520 of method 500 may erase only the second portion of string 430. The first portion string 430 may not be erased in activity 520 because it may have been erased in activity 510. For example, activity 520 may erase only memory cells 410 and 413 while memory cell 411 and 412 may not be erased in activity 520. In another example, activity 520 may erase only a first one of memory cells 410 and 413 (e.g., only memory cell 410) if memory cells 411, 412, and a second one of memory cells 410 and 413 (e.g., memory cell 413) are already erased in activity 510.

In activity 520, circuit 461 (FIG. 4) may cause the word lines corresponding the second portion of string 430 to be at one voltage, and the word lines corresponding the first portion of string 430 to be at another voltage unequal to the voltage at the word lines that correspond to the second portion of string 430. For example, when only memory cells 410 and 413 are erased in activity 520, circuit 461 may hold WL0 and WL3 at ground (or at some other voltage) and either float WL1 and WL2 or apply to WL1 and WL2 a voltage greater than the voltage at WL0 and WL3. In activity 520, the voltage at each of WL1 and WL2 may be greater than zero volts when circuit 461 floats WL1 and WL2. When circuit 461 floats WL1 and WL2 in activity 520, the voltage at each of WL1 and WL2 may be greater than the voltage at WL0 and WL3 (e.g., WL1 and WL2 may be greater than zero volts). In summary, method 500 may separately erase different portions of memory cells 410, 411, 412, and 413 of string 430 such that one portion of string 430 may be erased either before or after another portion is erased. For example, method 500 may erase only a first portion of string 430 in one activity (e.g., in activity 510), then method 500 may erase only a second portion of string 430 in another activity (e.g., activity 520) after the first portion of string 430 is erased.

In some embodiments, method 500 may have an activity 530 to erase memory cells 410, 411, 412, and 413 together (at the same time or in the same activity or erase operation) instead of erasing memory cells 410, 411, 412, and 413 separately (at different times or in separate activities or erase operations such as activities 510 and 520). Activity 530 may erase memory cells 410, 411, 412, and 413 while WL0, WL1, WL2, and WL3 have different voltages. For example, in activity 530 when memory cells 410, 411, 412, and 413 may be erased together, circuit 461 (FIG. 4) may cause WL0 and WL3 to have a first voltage and WL1 and WL2 to have a second voltage unequal to the first voltage. In some embodiments, in activity 530, the first voltage may be lower than the second voltage. For example, the first voltage may be ground and the second voltage may be greater than ground. In another example, the second voltage may be about one volt to about five volts and the first voltage may be lower than the second voltage.

In each of activities 510, 520, and 530 above, when at least one of the memory cells 410, 411, 412, and 413 is erased, circuit 462 (FIG. 4) may float SGS and SGD, and circuit 463 may apply $V_{ERASE}$ to well 407.

Method 500 may include an activity 540 to erase verify (perform an erase verify operation) string 430 of memory cells 410, 411, 412, and 413 after memory cells 410, 411, 412, and 413 are erased in either activity 530 or activities 510 and 520.

Method 500 may also include activity 550 to indicate the result of the first erase verify operation of activity 540. The result may be an unsuccessful or successful result. An unsuccessful result may indicate that memory cells may be over or under erased during activity 510, 520, or 530 such that the erase threshold voltage of the memory cells may be outside an acceptable erase threshold voltage range. A successful result may indicate that memory cells may be properly erased during activity 510, 520, or 530 such that the erase threshold voltage of the memory cells may be within an acceptable erase threshold voltage range.

If activity 550 indicates an unsuccessful result, then method 500 may repeat activities 510 and 520, or activity 530. If activity 550 indicates a successful result, then method 500 then may be done at activity 560.

The individual activities of method 500 may not have to be performed in the order shown or in any particular order. Some activities may be repeated, and others may occur only once. Various embodiments may have more or fewer activities than those shown in FIG. 5. For example, in some embodiments, method 500 may include the activities or operations of memory devices 100 and 200 described above and system 700 of FIG. 7 described below. In some embodiments, method 500 may include an embodiment of method 600 of FIG. 6 described below.

Table 1 shows additional example voltages of various signals for the erase operations memory device 400.

Activity 620 may perform a first erase verify operation. In some embodiments, the first erase verify operation in activity 620 may erase verify the entire string of memory cells. In other embodiments, the first erase verify operation in activity 620 may erase verify only a first selected portion of the string of memory cells. The first selected portion of the string may be either only intermediate memory cells of the string (such as memory cells 411 and 412 of string 430 of FIG. 4) or only edge memory cells (such as memory cells 410 and 413 of string 430 of FIG. 4). In some embodiments, erase verifying a memory cell may involve checking the erase threshold voltage the memory cells and determine if the erase threshold voltage is within an acceptable erase threshold voltage range.

Figure 6:
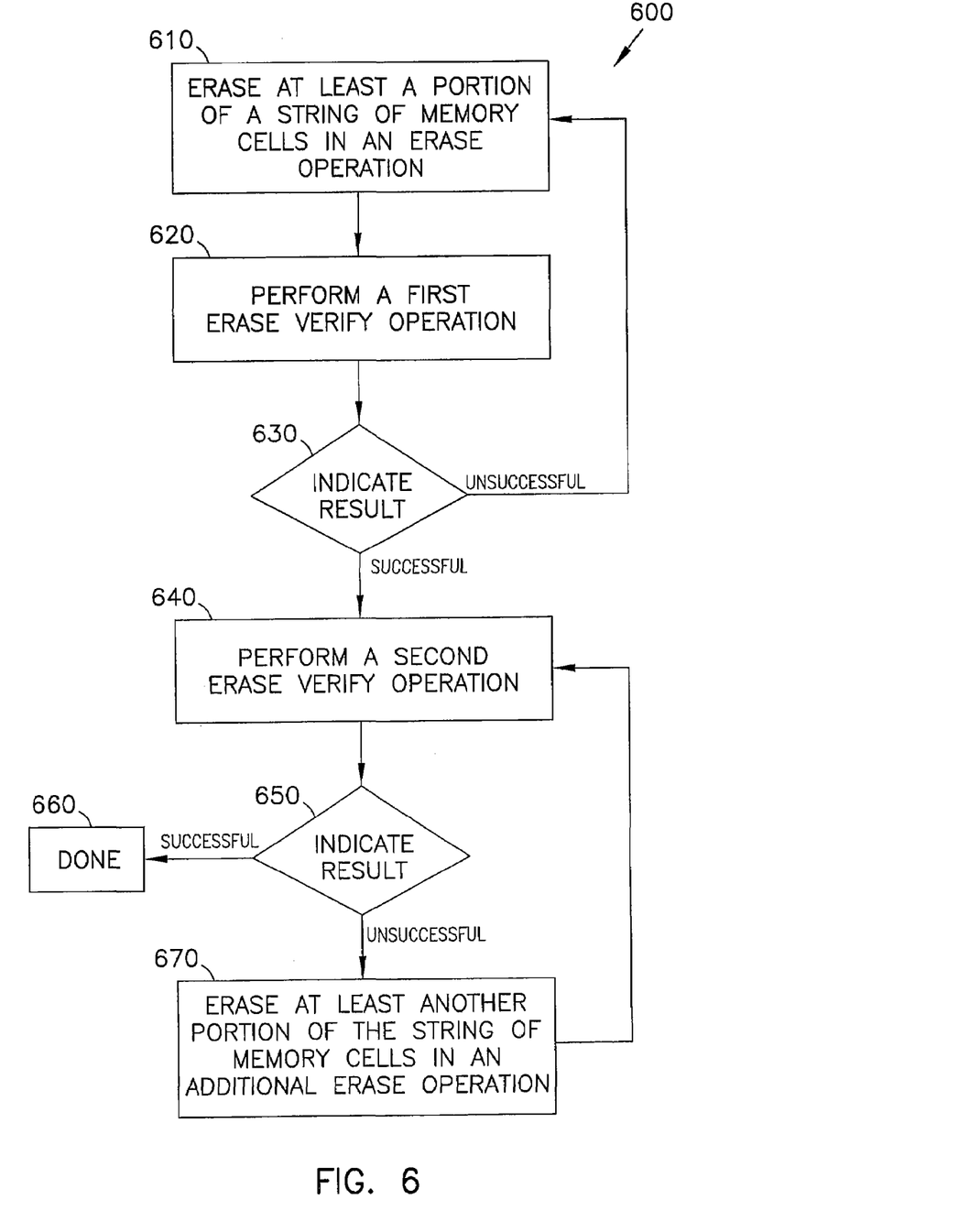
FIG. 6 is a flowchart of a method for an erase operation of a memory device according an embodiment of the invention.

Activity 630 may indicate the result of the first erase verify operation. The result may be an unsuccessful or successful result. An unsuccessful result may indicate that memory cells may be over or under erased during activity 610 such that the erase threshold voltage of the memory cells may be outside an acceptable erase threshold voltage range. A successful result may indicate that memory cells may be properly erased during activity 610 such that the erase threshold voltage of the memory cells may be within an acceptable erase threshold voltage range.

If activity 630 indicates an unsuccessful result, then method 600 may repeat activity 610. If activity 630 indicates a successful result, then method 600 may continue with activity 640.

TABLE 1

| | Example 1 | Example 2 | | Example 3 | |
|---|---|---|---|---|---|
| | Erase Memory Cells Associated with WL0, WL1, WL2, and WL3 | Erase only Memory Cells Associated with WL0 and WL3 | Erase only Memory Cells Associated with WL1 and WL2 | Erase only Memory Cells Associated with WL0 and WL3 | Erase only Memory Cells Associated with WL1 and WL2 |
| BL | Floating | Floating | Floating | Floating | Floating |
| SGD | Floating | Floating | Floating | Floating | Floating |
| WL3 | 0 V | 0 V | Floating | 0 V | 3 V (or 0~5 V) |
| WL2 | 1 V (or 0~5 V) | Floating | 0 V | 3 V (or 0~5 V) | 0 V |
| WL1 | 1 V (or 0~5 V) | Floating | 0 V | 3 V (or 0~5 V) | 0 V |
| WL0 | 0 V | 0 V | Floating | 0 V | 3 V (or 0~5 V) |
| SGS | Floating | Floating | Floating | Floating | Floating |
| SL | Floating | Floating | Floating | Floating | Floating |
| $V_{ERASE}$ | 20 V | 20 V | 20 V | 20 V | 20 V |

FIG. 6 is a flowchart showing a method 600 for an erase operation according to an embodiment of the invention. In some embodiments, method 600 may be used in a memory device such as memory device 100, 200, or 400 described in reference to FIG. 1 through FIG. 5. Thus, in some embodiments, the circuit elements, such as the memory cells, used in method 600 may include the circuit elements of the embodiments described above with reference to FIG. 1 through FIG. 5.

Method 600 of FIG. 6 may start with activity 610 to ease at least a portion of a string of memory cells in an erase operation. In some embodiments, activity 610 may include at least one of activities 510 and 520 of FIG. 5 to separately erase separate portions of the string of memory cells. In another example, activity 610 of FIG. 6 may include activity 530 FIG. 5 to erase the memory cells of the string together in the same erase operation. In FIG. 6, after the erase operation in activity 610, method 600 may continue with activity 620.

Activity 640 may perform a second erase verify operation to erase verify only a second selected portion of the string of memory cells and not the entire string. The second selected portion of the string may be a portion that may not have been erase verified in activity 620. For example, if only the intermediate memory cells of the string are erased verified in activity 620, then the second selected portion of the string (to be erase verified in this activity 640) may include only the edge memory cells. In the opposite, if only the edge memory cells of the string are erase verified in activity 620, then the second selected portion of the string (to be erase verified in activity 640) may include only the intermediate memory cells. In some embodiments, if the entire string of memory cells is erase verified in the first erase verify operation in activity 620, then the second selected portion of the string (to be erase verified in activity 640) may include only the edge memory cells. After the second erase verify operation in activity 640, method 600 may continue with activity 650.

Activity 650 may indicate the result of the second erase verify operation. If activity 650 indicates a successful result, then method 600 may be done at activity 660. If activity 650 indicates an unsuccessful result, then method 600 may continue with activity 670.

Activity 670 may erase at least an additional portion of the string of memory cells in an additional erase operation. The additional portion of the string may be the same as the second selected portion of the string that is unsuccessfully erase verified in activity 640. Thus, in some embodiments, the additional portion of the string of memory cells may be only the edge memory cells. In some embodiments, activity 670 may include an embodiment of activity 510 or 520 of FIG. 5 to separately erase only a portion of the string of memory cells. Since both activity 610 (described above) and activity 670 of method 600 may include an embodiment of activity 510 or 520, some of the functions of activity 610 may be repeated in activity 670. After the additional erase operation in activity 670, method 600 may repeat activity 640, and then continue to one or more of activities 650, 660, and 670 based on the result indicated by activity 650.

The individual activities of method 600 may not have to be performed in the order shown or in any particular order. Some activities may be repeated, and others may occur only once. Various embodiments may have more or fewer activities than those shown in FIG. 6. For example, in some embodiments, method 600 may include the activities or operations of memory devices 100, 200, and 400 described above and system 700 of FIG. 7 described below.

Table 2 shows additional example voltages that may be used in method 600.

TABLE 2

| | Example Voltages | | | |
|---|---|---|---|---|
| | Example 1 Erase Verify Memory Cells Associated with WL0 and WL3 | Example 2 Erase Verify only Memory Cells Associated with WL1 and WL2 | Example 3 Erase Verify only Memory Cells Associated with WL0 | Example 4 Erase Verify only Memory Cells Associated with WL3 |
| BL | 0 V (or 1 V) | 0 V (or 1 V) | 0 V (or 1 V) | 0 V (or 1 V) |
| SGD | 3.5 V | 3.5 V | 3.5 V | 3.5 V |
| WL3 | 0 V | >0 V and ≦6 V | >0 V and ≦6 V | 0 V |
| WL2 | >0 V and ≦6 V | 0 V | >0 V and ≦6 V | >0 V and ≦6 V |
| WL1 | >0 V and ≦6 V | 0 V | >0 V and ≦6 V | >0 V and ≦6 V |
| WL0 | 0 V | >0 V and ≦6 V | 0 V | >0 V and ≦6 V |
| SGS | 3.5 V | 3.5 V | 3.5 V | 3.5 V |
| SRC | 1.0 V (or 0 V) | 1.0 V (or 0 V) | 1.0 V (or 0 V) | 1.0 V (or 0 V) |
| $V_{ERASE}$ | 0 V | 0 V | 0 V | 0 V |

Figure 7:
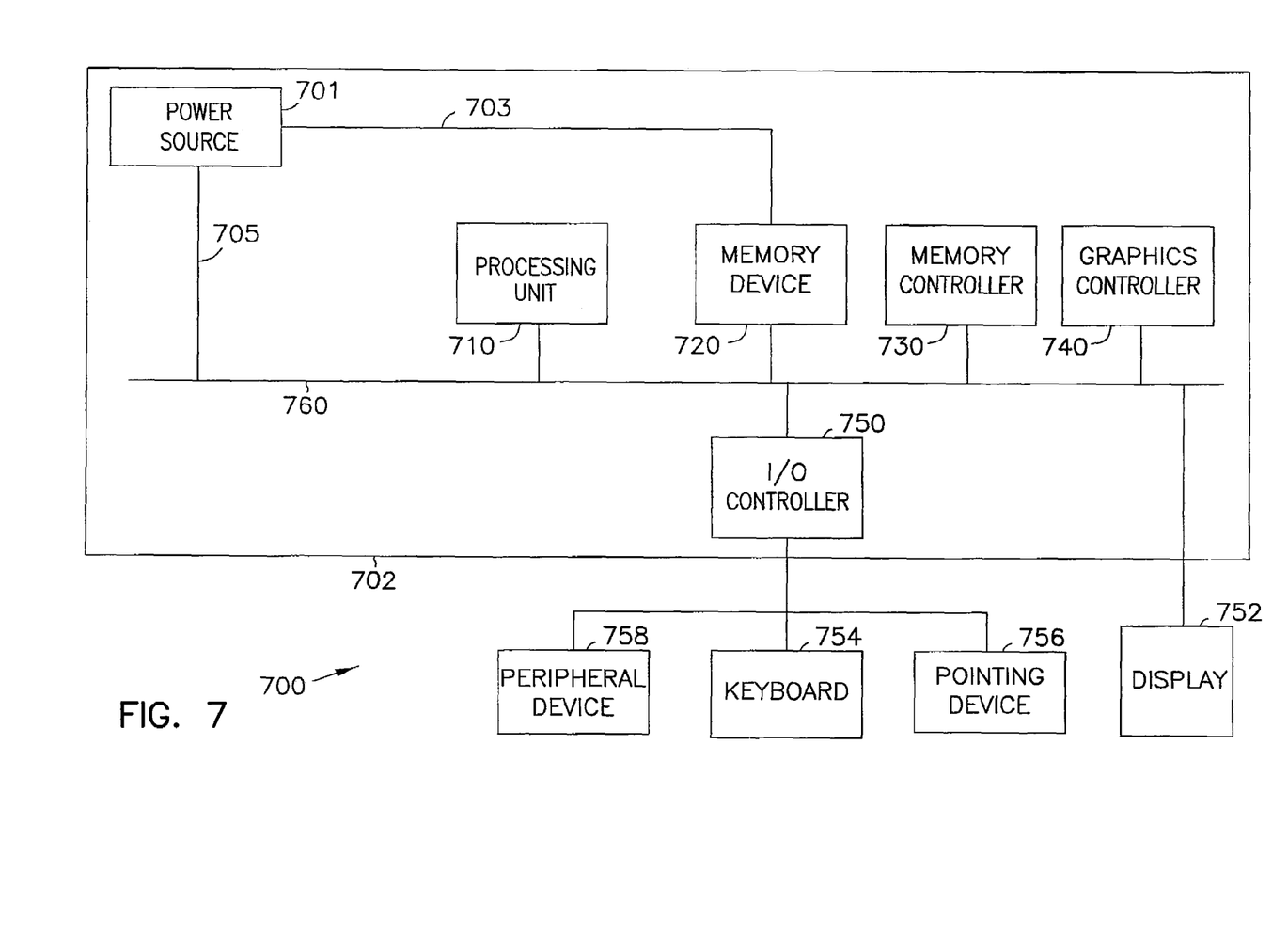
FIG. 7 shows a block diagram of a system according an embodiment of the invention.

FIG. 7 shows a block diagram of a system 700 according to an embodiment of the invention. System 700 may include a processing unit 710, a memory device 720, a memory controller 730, a graphics controller 740, an input and output (I/O) controller 750, a display 752, a keyboard 754, a pointing device 756, a peripheral device 758, and a bus 760. System 700 may also include a circuit board 702 on which some components of system 700 may be located, as shown in FIG. 7. Circuit board 702 may include terminals 703 and 705 coupled to a power source 701 to provide power or voltage to the components of system 700, including memory device 720. Power source 701 may be provided by alternating current to direct current (AC to DC) converting circuitry, a battery, or others. Memory device 720 may be a volatile memory device, a non-volatile memory device, or a combination of both. For example, memory device 720 may be a dynamic random access memory (DRAM) device, a static random access memory (SRAM) device, a flash memory device, or a combination of these memory devices. I/O controller 750 may include a communication module for wired or wireless communication. In some embodiments, the number of components of system 700 may vary.

Processing unit 710 may process data transferred to and from other components via bus 760. Processing unit 710 may include a general-purpose processor or an application specific integrated circuit (ASIC). Processing unit 710 may be a single core processing unit or a multiple-core processing unit.

In some embodiments, memory device 720 may include an embodiment of memory devices 100, 200, and 400 described above with reference to FIG. 1 through FIG. 5.

System 700 may include computers (e.g., desktops, laptops, hand-held devices, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape players, compact disc players, DVD players, video cassette recorders, DVD recorders, camcorders, digital cameras, MP3 (Motion Picture Experts Group, Audio Layer 3) players, video games, watches, etc.), and the like.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those of skill in the art upon reading and understanding the above description. Therefore, the scope of various embodiments of the invention is determined by the appended claims, along with the full range of equivalents to which such claims are entitled.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the scope or meaning of the claims.

What is claimed is:

1. A method comprising:
    erasing at least one memory cell of a string of memory cells of a memory device while a control gate of at least one of a first memory cell and a second memory cell of the string of memory cells has a first voltage and while a control gate of each memory cell of a plurality of intermediate memory cells of the string of memory cells has a second voltage, the plurality of intermediate memory cells being located between the first memory cell and the second memory cell, wherein erasing includes erasing only the plurality of intermediate memory cells when the second voltage is lower than the first voltage, and erasing only the first memory cell and the second memory cell when the second voltage is greater than the first voltage.

2. A method comprising:
    erasing at least one memory cell of a string of memory cells of a memory device while a control gate of at least one of a first memory cell and a second memory cell of the string of memory cells has a first voltage and while a control gate of each memory cell of a plurality of intermediate memory cells of the string of memory cells has a second voltage, the plurality of intermediate memory cells being located between the first memory cell and the second memory cell, wherein erasing includes erasing only the plurality of intermediate memory cells when the second voltage is lower than the first voltage.

3. The method of claim 2, wherein erasing includes erasing only the first memory cell and the second memory cell when the second voltage is greater than the first voltage.

4. The method of claim 3, wherein the second voltage is ground when only the plurality of intermediate memory cells is erased, and wherein the first voltage is ground when only the first memory cell and the second memory cell are erased.

5. The method of claim 4, wherein the first voltage is about one volt to about five volts when only the plurality of intermediate memory cells is erased, and wherein the second voltage is about one volt to about five volts when only the first memory cell and the second memory cell are erased.

6. The method of claim 3, wherein the plurality of intermediate memory cells is erased before the first memory cell and the second memory cell are erased.

7. The method of claim 3, wherein the plurality of intermediate memory cells is erased after the first memory cell and the second memory cell are erased.

8. The method of claim 1 further comprising:
applying an erase voltage to a well of the memory device, wherein at least a portion of the string of memory cells is formed on the well; and
floating a gate of a select transistor coupled between the string of memory cells and one of a bit line and a source line of the memory device, the string of memory cells being coupled between the bit line and the source line.

9. The method of claim 1 further comprising:
applying an erase voltage to a well of the memory device, wherein at least a portion of the string of memory cells is formed on the well; and
floating a gate of at least one select transistor coupled between a bit line and a source line of the memory device, wherein the string of memory cells is coupled between bit line and the source line.

10. The method of claim 1 further comprising:
erase verifying only the first memory cell and second memory cell in a first erase verify operation; and
erase verifying the plurality of intermediate memory cells in a second erase verify operation.

11. The method of claim 10, wherein erasing the at least one memory cell includes erasing the first memory cell and the second memory cell before erasing the plurality of intermediate memory cells, wherein the first erase verify operation is performed before the second erase verify operation, and wherein the second erase verify operation is performed only when the first erase verify operation indicates a successful result.

12. The method of claim 10, wherein erasing the at least one memory cell includes erasing the first memory cell and the second memory cell after erasing the plurality of intermediate memory cells, wherein the first erase verify operation is performed after the second erase verify operation, and wherein the first erase verify operation is performed only when the second erase verify operation indicates a successful result.

13. The method of claim 10 further comprising:
repeating the erasing of the at least one memory cell of the string of memory cells of the memory device while the control gate of at least one of the first memory cell and the second memory cell of the string of memory cells has the first voltage and while the control gate of each memory cell of the plurality of intermediate memory cells has the second voltage, wherein repeating is performed when one of the first and second erase verify operations indicates an unsuccessful result.

14. The method of claim 13, wherein the second voltage is greater than the first voltage, and wherein repeating the erasing includes erasing only at least one of the first memory cell and the second memory cell.

15. An apparatus comprising:
a string of memory cells including a first memory cell, a second memory cell, and a plurality of intermediate memory cells coupled between the first memory cell and the second memory cell; and
a circuit to erase at least one memory cell of the string of memory cells while a first control gate of at least one of the first and second memory cells has a first voltage and while a second control gate of each memory cell of the plurality of intermediate memory cells has a second voltage, the circuit further to erase only the plurality of intermediate memory cells when the second voltage is lower than the first voltage.

16. The apparatus of claim 15 further comprising a well, a bit line, and a select transistor coupled between the first memory cell and the bit line, wherein at least a portion of at least one memory cell of the string of memory cells is formed on the well.

17. The apparatus of claim 16 further comprising a source line, and a second select transistor coupled between the second memory cell and the source line.

18. An apparatus comprising:
a string of memory cells including a first memory cell, a second memory cell, and a plurality of intermediate memory cells coupled between the first memory cell and the second memory cell; and
a circuit to erase at least one memory cell of the string of memory cells while a first control gate of at least one of the first and second memory cells has a first voltage and while a second control gate of each memory cell of the plurality of intermediate memory cells has a second voltage, wherein the circuit is to erase only the plurality of intermediate memory cells when the second voltage is lower than the first voltage, and to erase only the first memory cell and the second memory cell when the second voltage is greater than the first voltage.

19. The apparatus of claim 18, wherein the circuit is to hold the second voltage at ground when only the plurality of intermediate memory cells is erased, and to hold the first voltage at ground when only the first memory cell and the second memory cell are erased.

20. The apparatus of claim 15 further comprising a well, a bit line, a source line, a first select transistor coupled between the bit line and the string of memory cells, a second select transistor coupled between the source line and the string of memory cells, wherein at least a portion of at least one memory cell of the string of memory cells is formed on the well, wherein the circuit is to apply an erase voltage to the well, and wherein the circuit is to float a gate of at least one of the first and second select transistors when at least one memory cell of the string of memory cells is erased.

21. The apparatus of claim 15, wherein the circuit is to erase verify only the first memory cell and the second memory cell in a first erase verify operation, and to erase verify the plurality of intermediate memory cells in a second erase verify operation.

22. An apparatus comprising:
a string of memory cells including a first memory cell, a second memory cell, and a plurality of intermediate memory cells coupled between the first memory cell and the second memory cell; and
a circuit to erase at least one memory cell of the string of memory cells while a first control gate of at least one of the first and second memory cells has a first voltage and while a second control gate of each memory cell of the plurality of intermediate memory cells has a second voltage, the circuit to erase verify only the first memory cell and the second memory cell in a first erase verify operation, to erase verify the plurality of intermediate memory cells in a second erase verify operation, and, wherein the circuit is to cause the second erase verify operation to be performed only when the first erase verify operation indicates a successful result.

23. The apparatus of claim 21, wherein the circuit is to cause the first erase verify operation to be performed only when the second erase verify operation indicates a successful result.

24. The apparatus of claim 21, wherein the circuit is to repeat the erasing at least one memory cell of the string of memory cells of the memory device while the first control gate of at least one of the first memory cell and the second memory cell of the string of memory cells has the first voltage and while the second control gate of each memory cell of the plurality of intermediate memory cells has the second voltage, wherein the circuit is to repeat erasing when one of the first and second erase verify operations indicates an unsuccessful result.

25. A system comprising:
a flash memory device including a string of memory cells with a first memory cell, a second memory cell, and plurality of intermediate memory cells coupled between the first memory cell and the second memory cell, and a circuit to erase at least one memory cell of the string of memory cells of a memory device while a first control gate of at least one of the first and second memory cells has a first voltage and while a second control gate of each memory cell of the plurality of intermediate memory cells has a second voltage, the circuit further to erase only the plurality of intermediate memory cells when the second voltage is lower than the first voltage; and
a circuit board coupled to the flash memory device, the circuit board including a terminal to couple to a battery to provide a voltage to the flash memory device.

26. The system of claim 25 further comprising a well, a bit line, a source line, a first select transistor coupled between the bit line and the string of memory cells, a second select transistor coupled between the source line and the string of memory cells, wherein at least a portion of at least one memory cell of the string of memory cells is formed on the well, wherein the circuit is to apply an erase voltage to the well, and wherein the circuit is to float a gate of at least one of the first and second select transistors when at least one memory cell of the string of memory cells is erased.

27. The system of claim 26, wherein the circuit is to erase verify only the first memory cell and second memory cell in a first erase verify operation, and to erase verify the plurality of intermediate memory cells in a second erase verify operation.

* * * * *